Dec. 3, 1957 I. G. A. CRESSELL ET AL 2,814,852

SEMI-CONDUCTOR AMPLIFIERS AND TRANSMITTERS

Filed March 6, 1953

Inventors:
Ian George Archie Cressell
Michael Frederick Madigan
William Edward Copsey
Attorneys:
Baldwin & Wight 2,814,852
Patented Dec. 3, 1957

2,814,852

SEMI-CONDUCTOR AMPLIFIERS AND TRANSMITTERS

Ian George Archie Cressell, Black Notley, near Braintree, Michael Frederick Madigan, Brentwood, and William Edward Copsey, Galleywood, England, assignors to Marconi's Wireless Telegraph Company Limited, London, England, a company of Great Britain Application March 6, 1953, Serial No. 340,714

Claims priority, application Great Britain March 10, 1952

3 Claims. (Cl. 29—25.3)

This invention relates to semi-conductor amplifiers and transistors—sometimes called hybrid amplifiers—of the kind in which an emitter is used in contact with a junction formed in a semi-conductive body so as to modulate the conduction characteristics of the junction by the injection of "holes" or electrons. The term "holes" as herein employed refers to carriers of positive electric charges as distinguished from carriers, such as electrons, of negative charges. The invention has for its object to produce a semi-conductor amplifier or transistor of good performance and one which shall be readily reproducible in manufacture.

According to this invention a method of making a semi-conductor amplifier includes the steps of forming a P-N junction in a body of germanium and, after annealing the same, etching said body to render the junction visible, one or more point or line like emitters being then mounted in contact with the junction.

Preferably the etching process is continued sufficiently far to form a shoulder on the body at the junction, the emitter or emitters being then mounted to give point or line contact at the shoulder. The P-N junction may be a so-called lattice defect junction or it may be formed between aluminium or gallium doped P-type germanium and nitrogen, arsenic or antimony doped germanium.

There are known methods of producing defect type junctions by thermal conversion from high purity N-type germanium and such methods may be used in carrying out the present invention. The said invention also provides a preferred and improved method of producing an impurity doped junction such as between aluminium doped germanium and arsenic doped germanium.

Figure 1:
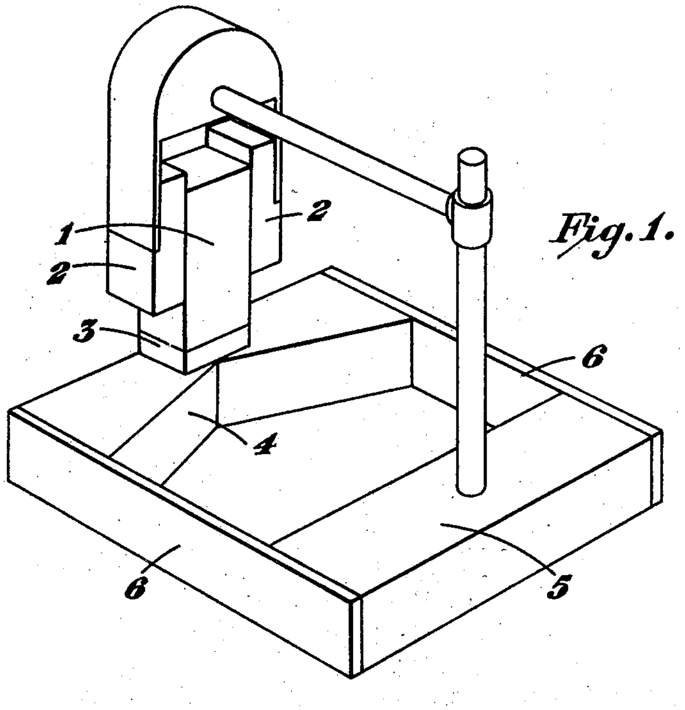
Figure 2:
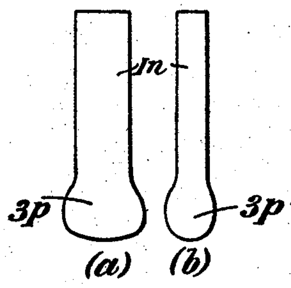
Figure 3:
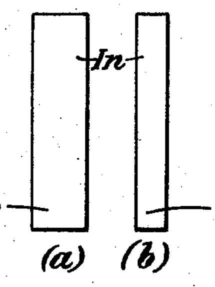
Figure 4:
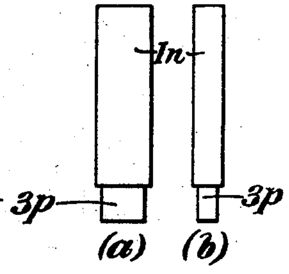
Figure 5:
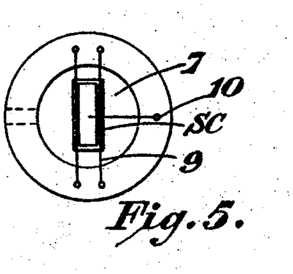
Figure 6:
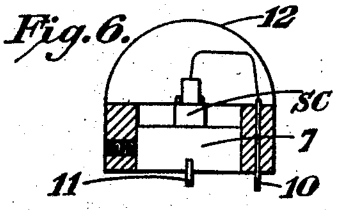

The invention is illustrated in and explained in accordance with the accompanying drawings in which the Fig. 1 is a schematic diagram showing one form of apparatus for carrying out the method of this invention; Figs. 2, 3 and 4 show three stages of production, each stage being illustrated by mutually perpendicular views (*a*) (*b*) of the specimen as obtained at the appropriate stage; and Figs. 5 and 6 are respectively a schematic plan and elevation of one form of amplifier or transistor in accordance with the invention.

Referring first to Fig. 1, a piece 1 of N-type germanium preferably of single crystal material whose dimensions may be, for example 2 mm. x 1 mm. x 10 mm., is clamped between high purity graphite blocks 2 so as to be held vertical in the manner shown. A second piece 3 of P-type germanium and whose dimensions may be, for example 2 mm. x 1 mm. x 3 mm. is placed on a horizontal graphite heater element 4 so that the two pieces 1 and 3 of germanium are in good thermal contact. A suitable insulating block 5 serves as to carry a main support member for the graphite clamp blocks and also for the attachment of heavy copper current leads 6 by which current may be passed through the heater 4. The N-type germanium used for the piece 1 preferably is of resistivity in the range 0.5–10 ohm cm. and is doped with nitrogen, antimony or arsenic. The P-type germanium used for the piece 3 preferably is of resistivity in the range .01–10 ohm cm. and is doped with aluminium or gallium.

The apparatus illustrated in Fig. 1 is mounted in a suitable chamber which is evacuated to a pressure of $10^{-5}$ mm. of mercury. The small piece 3 is raised to its melting point by the heater 4 and fuses on the piece 1 where it is held by its own surface tension. The heater is then switched off and cooling takes place at such a rate as to promote extension of the crystal structure existing in the piece 1. The form of the specimen after fusing is as shown in Figs. 2*a* and 2*b* and consists of a low resistivity P-type tip marked 3*p* attached to a high resistivity N-type body marked 1*n* and which is usually found to have been thermally converted to high resistivity P-type material for a distance of about 2 mm. from the fusion junction.

The specimen is then ground to rectangular cross section as shown in Figs. 3*a* and 3*b* and given a light acid etch to remove surface contaminants. It is then sealed in a Pyrex tube and annealed under vacuum for about 72 hours at about 480° C., to reconvert the high resistivity P-type material near the junction back to high resistivity N-type. The ends of the specimen are then lightly nickel plated and soldered connections made thereon, the said connections being masked with Glyptal or similar varnish.

The specimen is then anodically etched electrolytically until it takes a form as shown in Figs. 4*a* and 4*b*. The step in the process is best effected in a decinormal caustic potash solution as electrolyte, a platinum counter-electrode being used. A current density of about 1 amp./sq. cm. is suitable for this etching step during which the germanium takes a high polish. Owing to the fact that the P-type material etches faster than the N-type, a shoulder is produced where the P-N junction occurs. The high reverse impedance P-N junction produced is found to be quite stable to exposure to air.

The P–N junction is then checked for photosensitivity and rectification characteristics and soldered to a cylindrical brass stud 7 as shown in Figs. 5 and 6, these figures illustrating a hybrid amplifier assembly in which a semi-conductor element produced as above described is used. In Figs. 5 and 6 the semi-conductor is schematically indicated with the general reference SC, the shoulder being exaggerated somewhat. The brass stud 7 is mounted in a suitable insulated holder and on the shoulder are located one or more (as shown two) line emitters 9 which may consist for example, of Phosphor bronze wires running parallel to the shoulder and about 5/1000" thick. A connection to the P-type material is made via a suitable pin 10 in the insulating base, a pin 11 making connection through the stud to the N-type material. The assembly is protected by an insulating cap 12 which is filled with a suitable grease, for example, silicone grease.

An amplifier or transistor in accordance with this invention and as above described gives good circuit performance with small internal noise and stability against overload. Moreover, the emitter or emitters 9 being self locating in the shoulder, require no expensive precision assembly. A current gain of the order of unity is obtained and is maintained for values of collector voltage as low as 1½ volts. An emitter input resistance of less than 50 ohms combined with a collector output impedance of over 100,000 ohms is obtainable.

We claim:

1. A method of making a semi-conductor amplifier which includes the steps of forming a P–N junction in a body of germanium, and after annealing the same, etching said body to form a shoulder at said junction, said etching process being continued sufficiently far to render said junction visible, said shoulder being so formed as to constitute a means for positively locating an emitter on said shoulder at a predetermined distance from the collector electrode, one or more emitters consisting of wires of suitable material being mounted so as to lie parallel with and on the surface of said shoulder thereby giving contact with said surface.

2. A method as claimed in claim 1, wherein connection to the P-type material is made by means of a metallic pin in an insulating base which holds the amplifier.

3. A method as claimed in claim 1, wherein a metal pin which contacts the N-type material is held by a cylindrical stud soldered to the N-type material.

References Cited in the file of this patent

UNITED STATES PATENTS

| | | |
|---|---|---|
| 2,597,028 | Pfann | May 20, 1952 |
| 2,602,763 | Scaff et al. | July 8, 1952 |
| 2,656,496 | Sparks | Oct. 20, 1953 |